United States Patent [19]

Ahmed

[11] 3,904,976

[45] Sept. 9, 1975

[54] CURRENT AMPLIFIER

[75] Inventor: Adel Abdel Aziz Ahmed, Annandale, N.J.

[73] Assignee: RCA Corporation, New York, N.Y.

[22] Filed: Apr. 15, 1974

[21] Appl. No.: 461,229

[52] U.S. Cl. .................... 330/30 D; 330/17; 330/19; 330/22

[51] Int. Cl.[2] ........................ H03F 3/04; H03F 3/68

[58] Field of Search ...... 330/17, 19, 22, 30 D, 38 M

[56] References Cited

UNITED STATES PATENTS

| | | | |
|---|---|---|---|
| 3,760,288 | 9/1973 | Leonard | 330/30 D |
| 3,813,607 | 5/1974 | Voorman | 330/17 |
| 3,815,037 | 6/1974 | Wheatly, Jr. | 330/19 |

*Primary Examiner*—R. V. Rolinec
*Assistant Examiner*—Lawrence J. Dahl
*Attorney, Agent, or Firm*—H. Christoffersen; S. Cohen; A. L. Limberg

[57] ABSTRACT

The emitter current supplied from a transistor is maintained proportionally related by a factor $k$ to current withdrawn from a first resistive network. This is done by applying the collector current of the transistor to a second resistive network having a current-versus-voltage characteristic proportionally related by the factor $k$ to that of the first resistive network, comparing the potentials developed across the first and the second resistive networks in a differential amplifier to develop and to amplify an error signal, and then applying the amplified error signal to the base electrode of the transistor so as to degenerate error signal.

28 Claims, 10 Drawing Figures

CURRENT AMPLIFIER

Figure 1:
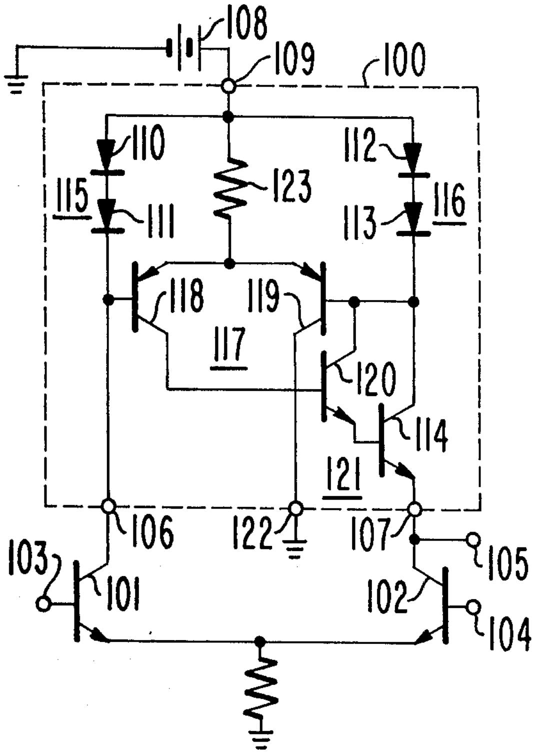

The present invention relates to current amplifiers having well-defined current gains.

Monolithic integrated circuits customarily use current amplifiers to solve the level shifting problems caused by the extensive use of direct coupling between stages within each circuit. A class of current amplifiers having well-defined current gains as determined by the ratio of the transconductances of two transistors is known; these current amplifiers are commonly termed "current mirror amplifiers" or simply "current mirrors." Proportioning of the transconductances of the transistors is accomplished by controlling their physical dimensions. For the gain of a current mirror amplifier to be accurately fixed (to within a 2 per cent tolerance or so) by the ratio of the transconductances of two transistors, the transistors should exhibit high common-emitter current gains (50 or more). Practically speaking, for lateral PNP transistors of reasonable size, this high current gain is difficult to achieve at current levels of hundreds of microamperes or larger.

Prior art current mirror amplifiers employing PNP lateral transistors exhibit other shortcomings. Their output impedance at higher output current levels tends to be substantially lower than that of their NPN counterparts. The common-emitter forward current gains of the PNP laterals are affected by temperature, so schemes in which the dimensions of the lateral PNP transistors are adjusted to compensate for these gains being low do not provide adequate compensation over a wide range of temperature.

For certain applications—such as that described in my concurrently filed U.S. Pat. Application Ser. No. (RCA 67,499), entitled "Ground Fault Detection Apparatus" and assigned to a common assignee—previously known current mirror amplifiers employing lateral PNP transistors have inadequately well-defined current gains.

The present inventor determined the shortcomings of prior art current mirror designs, insofar as their current gains being undesirably affected by the base currents of lateral-structural PNP transistors used in their construction, were attributable to these base current components being improperly apportioned between the input and output currents of the current mirror amplifier. He perceived that apportioning the base currents of the lateral-structrure PNP transistors between the output and input currents of a current amplifier in proportion to the current gain of the current amplifier would forestall such shortcoming. This concept of invention is implemented in current amplifier configurations of a new type.

The present invention is embodied in a three-terminal current amplifier with current gain $k$. The current amplifier has a first resistive means connected in a first path between its input and common terminals; a second resistive means with a conductance proportional by the factor $k$ to the conductance of the first resistive means, connected in a second path between said output and common terminals to sense the current flow in that second path; and means responsive to the potentials across the first resistive means and to the potential across the second resistive means for controlling the current passing through the second path to maintain these two potentials substantially equal.

In the drawing, FIGS. 1–10 are schematic diagrams of various current amplifiers embodying the present invention.

FIG. 1 shows within dotted outline a current amplifier 100, which embodies the present invention and provides active collector loads to the emitter-coupled differential amplifier transistors 101 and 102. An input signal is biased intermediately (by means not shown) between the positive and negative potentials of operating supply 108. This input signal is applied between input terminals 103 and 104 at the base electrodes of transistors 101 and 102 to cause oppositely phased variations in the respective collector currents of transistors 101 and 102. The collector current variations of transistor 102 are applied directly to the output terminal 105. The collector current variations of transistor 101 are applied as input current variations to the input terminal 106 of current amplifier 100. Amplifier 100 responds to these variations to provide oppositely phased output current variations from its output terminal 107, which is connected to output terminal 105. The current amplifier 100 is thus used to convert push-pull collector current variations from transistors 101 and 102 into single-ended form for application to a load (not shown) connected between terminal 105 and a point of reference potential, which reference potential is intermediate between the positive and negative potentials of operating supply 108.

Operating supply 108 provides an operating potential to the common terminal 109 of current amplifier 100. Quiescent collector current is provided to transistor 101 from supply 108 via terminal 109, diodes 110 and 111 which are forward biased by the current flow and terminal 106. Quiescent collector current is provided to transistor 102 from supply 108 via terminal 109, diodes 112 and 113 which are forward biased by the current flow, the collector-to-emitter path of transistor 114, and the terminal 107.

Diodes 110 and 111 provide a first non-linear resistive network 115, used as the collector load of transistor 101. The potential across each of the diodes increases only about 18 millivolts each time the collector current of transistor 101 is doubled, so wide ranges of collector current flow to transistor 101 can be accomodated with only modest changes in the potential drop across the non-linear resistive network 115. Diodes 112 and 113 provide a second non-linear resistive network 116 with a current characteristic which is proportional, by a factor $k$, to that of the non-linear resistive network 115 at any given potential. Therefore, by adjusting the potential drops across non-linear resistive networks 115 and 116 to be equal, the ratio of the current flowing through network 116 to the current flowing through network 115 can be accurately determined to be $k$.

For example, assume non-linear resistive networks 115 and 116 have like current-versus-potential characteristics, by reason of diodes 110 and 111 having the same structures as diodes 112 and 113. Then, by causing the potential drop across non-linear resistive network 116 to equal that across non-linear resistive network 115, the currents flowing in the two networks will be equal to each other.

The adjustment of the potential drop across non-linear resistive network 116 is made by means of degenerative feedback. The potential drops across networks 115 and 116 are applied respectively to the inverting input port and to the non-inverting input port of a differential amplifier, 117, shown in FIG. 1 as comprising an emitter-coupled pair of transistors 118 and 119, which develops across its output port an error signal proportional to the difference between these potential drops, but magnified in amplitude. (The inverting input port of differential amplifier 117 is between the base electrode of transistor 118 and terminal 109. The non-inverting input port of differential amplifier 117 is between the base electrode of transistor 119 and terminal 109. The output port of differential amplifier 117 is between the collector electrode of transistor 118 and terminal 122.) This error signal is applied from the collector electrode 118 via the emitter follower action of transistor 120 to the base electrode of transistor 114 to adjust its conduction.

This adjustment is of a sense which tends to reduce the error signal. That is, if the potential drop across network 116 exceeds that across network 115, the conduction of transistor 118 will be decreased relative to that of transistor 119. This will reduce the base current supplied to transistor 120 from the collector electrode of transistor 118, in turn reducing the conduction of transistor 120 and causing it to supply less base current to transistor 114. This reduces the conduction of the collector-to-emitter path of transistor 114 and thereby decreases the current flow through network 116 to reduce the potential drop across network 116.

On the other hand, however, if the potential drop across network 116 is smaller than that across network 115, the relative conduction of transistor 118 will be increased with respect to that of transistor 119. This will increase the base current supplied to transistor 120 from the collector electrode of transistor 118, in turn increasing the conduction of transistor 120 and causing it to supply more base current to transistor 114. This increases the conduction of the collector-to-emitter path of transistor 114 and thereby increases the current flow through network 116 to develop a larger potential drop across network 116.

Transistors 120 and 114 are in Darlington cascade connection and in effect form a composite transistor 121 with common-emitter forward current gain substantially equal to the product of the common-emitter forward current gains of transistors 120 and 114. The base electrode of transistor 120 provides the "base electrode" of this composite transistor 121; the emitter electrode of transistor 114 provides the "emitter electrode" of this composite transistor 121; and the joined collector electrodes of transistors 114 and 120 provide the "collector electrode" of the composite transistor 121. The "emitter" current of this composite transistor 121 is withdrawn via terminal 107 and is known to be equal to the sum of its "base" and "collector currents," like that of a conventional transistor. Since the common-emitter forward current gain of composite transistor 121 can reasonably be expected to be very high (exceeding 2500 if transistors 120 and 114 have common-emitter forward current gains exceeding 50, which is the usual circumstance), its "collector" current is almost identical in magnitude to its "emitter" current.

Since the "collector" current of the composite transistor 121 is the predominant cause of the potential drop across non-linear resistive network 116 it should be in predetermined proportion to the collector current of transistor 101, which is the predominant cause of the potential drop across non-linear resistive network 115. This has to be so in order that the potential drops across networks 115 and 116 be equal and that the error signal be zero-valued. This "predetermined proportion" is the proportion between the current-versus-potential characteristic of non-linear resistance network 116 to that of non-linear resistance network 115. When the "collector" current of composite transistor 121 is in this predetermined proportion to the collector current of transistor 101, then—since the "collector" and "emitter" currents of composite transistor 121 are very nearly identical in magnitude—the "emitter" current of composite transistor 121 is in substantially the same predetermined proportion with the collector current of transistor 101.

In other words, the output current from output terminal 107 of current amplifier 100 is in this predetermined proportion with the input current withdrawn from its input terminal 106. In the specific case where the predetermined proportion between the current-versus-potential characteristics of the non-linear resistive networks 115 and 116 is unity, the magnitudes of the input and output currents flowing through input terminal 106 and through output terminal 107, respectively, will be equal.

More generally, assume diodes 110, 111, 112, 113 to be made of similar semiconductive material and to have similar diffusion profiles. Then, if diodes 112 and 113 were made to have $k$ times as much junction area as diodes 110 and 111, respectively, the current through diodes 112 and 113 would have to be $k$ times as large as the current through diodes 110 and 111 in order that the potential drop across network 116 would be equal to the potential drop across network 115. ($k$ is any positive number.) This is so because, as is well known, the potential drop across a semiconductor junction is determined by the density of current therethrough. The predetermined proportion between the current-versus-potential characteristics of non-linear resistance networks 115 and 116 is $1{:}k$. The output current supplied from output terminal 107 of current amplifier 100 will be $k$ times as large as the input current withdrawn from its input terminal 106.

Some care must be taken in the design of the FIG. 1 current amplifier 100 if the quiescent base currrents of transistors 118 and 119 are to match each other, which is desirable to obtain the most accurate and predictable proportions between the input and output currents of the current amplifier. For this matching condition, the collector current of transistor 119 flowing through terminal 122 to ground potential should equal the collector current of transistor 118 provided to the base electrode of transistor 120. A nominal value of this latter collector current can be determined if one knows the quiescent output current to be supplied by current amplifier 100 from its output terminal 107. This output current is divided by the expected common-emitter forward current gain of composite transistor 121 to determine the nominal value of its quiescent base current, which is also the quiescent collector current of transistor 118.

To make the quiescent collector currents of transistors 118 and 119 substantially equal, a current twice as large as the quiescent collector current of transistor 118 should be supplied to the joined emitter electrodes of transistors 118 and 119. Since the potential at the joined emitter electrodes of transistors 118 and 119 is well-defined, being equal to the sum of the junction offset potentials across serially connected diodes 110 and 111 minus the base-emitter junction offset potential of transistor 118 (or, alternatively, the sum of the junction offset potentials of serially-connected diodes 112 and 113 minus the base-emitter junction offset potential of transistor 119), the current flow through resistive element 123 can be made the desired value by choosing its resistance in accordance with Ohm's Law.

It should be noted that the non-linear resistance networks 115 and 116 and the differential amplifier 118, 119 regulate the potential across the resistor 123 connected between the terminal 109 and the joined emitter electrodes of transistors 118 and 119. This regulatory function, causing resistor 123 to act as a substantially constant-current source, is in addition to their function in proportioning the output current from terminal 107 to the input current withdrawn from terminal 106. The non-linear resistance networks 115 and 116 can also perform an important role in maintaining the bandwidth of the PNP transistor differential amplifier 117. These non-linear resistive networks 115 and 116 tend to have low dynamic resistance reducing the tendency towards self-oscillation in transistors 118 and 119 which might otherwise occur due to their collector-to-base capacitance.

While FIG. 1 shows the use of a composite transistor 121 in the degenerative feedback loop proportioning the output to input currents of the current amplifier 100, it should be appreciated that a single transistor could be used instead of composite transistor 121. The lower current gain of the single transistor would result in the predetermined proportioning of the output current from terminal 107 to the input current withdrawn from terminal 106 being less accurately determined, however. In the claims the word "transistor" is to be construed as including both a single transistor and a composite transistor—that is, a circuit displaying the characteristics like those of a transistor.

Figure 2:
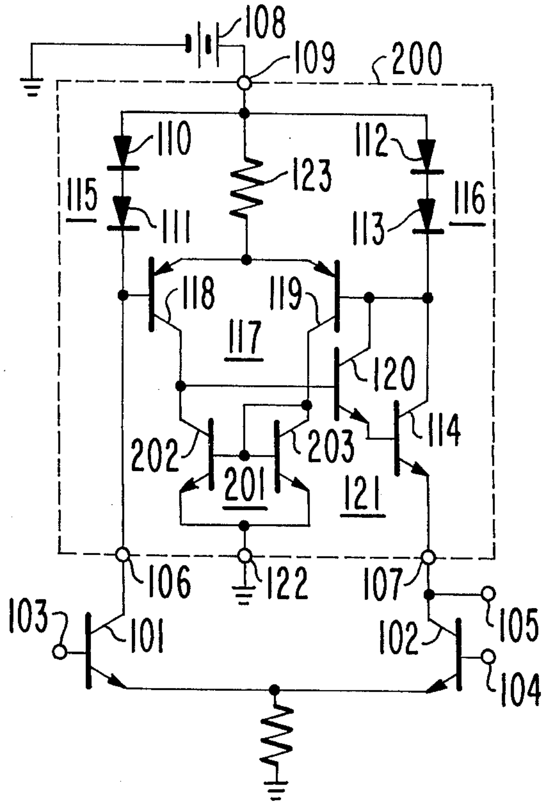

FIG. 2 shows a modification 200 of current amplifier 100. In current amplifier 200, the resistance of resistor 123 is chosen substantially smaller than the value required to develop a current flow therethrough substantially twice that required to supply base current to transistor 120. This causes emitter-currents in transistors 118 and 119 substantially larger than the base current to be supplied to transistor 120. The transconductance of a transistor increases proportionally with increasing emitter current. The amount of error signal potential required between the base electrodes of transistors 118 and 119 to provide base current to transistor 120 is substantially diminished because of the higher transconductances of transistors 118 and 119.

The excess collector current of transistor 118 not needed to supply base current to transistor 120 is disposed of in a current sink provided by the output port of a current mirror amplifier 201. Current mirror amplifier 201 is a current amplifier with inverting current gain. The collector current of transistor 119 is applied to the input port of the current mirror amplifier 201 which responds at its output port to withdraw a similar-value current from the collector electrode of transistor 118. The type of current mirror amplifier shown, comprising a common-emitter amplifier transistor 202 with its base-emitter junction parallelled by a similar transistor 203 connected in diode-configuration, is one of several known alternative current mirror amplifier configurations, which may be used to provide the desired current sinking function.

It should be noted that in a practical circuit, the value of currents flowing to the current mirror amplifier 201 from the collector electrodes of transistors 118 and 119 far exceeds the value of the base current applied to transistor 120 of the composite transistor 121. The effects of the currents flowing to the current mirror amplifier 201 upon the base-emitter offset potentials of transistors 118 and 119 therefore far outshadows the effect of the base current flow to transistor 120. The current mirror amplifier 201 can maintain the currents supplied from the collector electrodes of transistors 118 and 119 in fixed proportion, the negative feedback afforded by composite transistor 121 to the differential amplifier 117 permitting this condition to obtain. The proportioned emitter-to-collector currents of transistors 118 and 119 can then be used to match their base-emitter offset potentials closely.

More particularly, in a preferred embodiment of the FIG. 2 circuit, the area of the base-emitter junction of transistor 119 will be made $k$ times as large as the area of the base-emitter junction of transistor 118 and the current mirror amplifier 201 will be made to have a current gain of $-1/k$. This results in the base-emitter offset potentials of transistors 118 and 119 being equal and causes the base currents of transistors 118 and 119 to affect the potential offsets across resistive networks 115 and 116 similarly. All second order effects of consequence in adversely affecting the predicted current gain of current amplifier 200 are thus caused to compensate for each other. The current gain of the particular current mirror amplifier 201 shown in FIG. 2 will be $-1/k$ if transistors 202 and 203 have matching diffusion profiles and also have base-emitter junction areas in a $1:k$ ratio, respectively.

Figure 3:
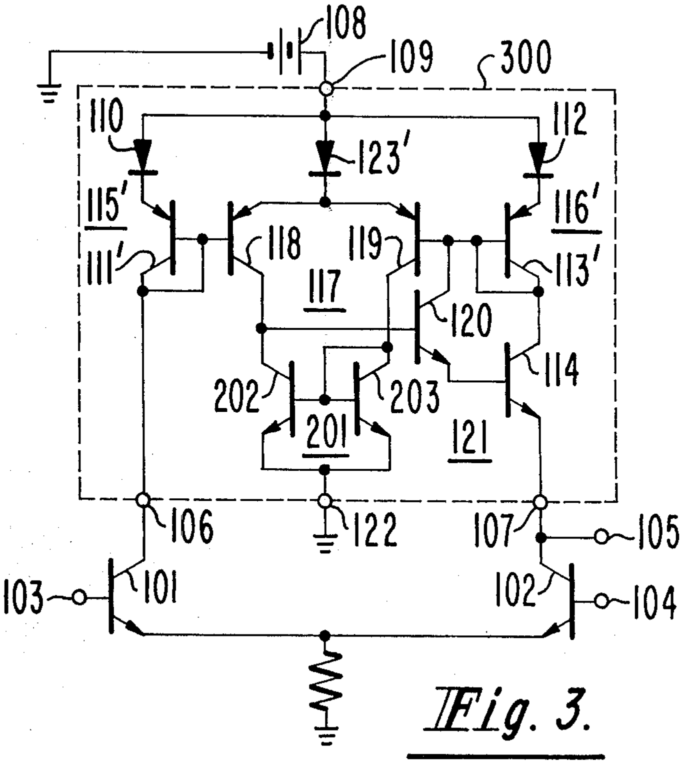

FIG. 3 shows current amplifier 300 wherein resistive element 123 is constructed as a semiconductor diode 123'. Since the potential across diode 123' varies proportionally with current and temperature as the potential across diode 110 or 112, diode 123' in this connection functions as a source of current proportional to the input current withdrawn from terminal 106. Presuming diode-connected transistor 111' identical in structure and operating characteristics to transistor 118, the ratio of the current flowing in diode 123' to that flowing in diode 110 will be the same as the ratio of the junction area of diode 123' to that of diode 110. In the case where diodes 110, 112 and 123' are diode-connected transistors the junction areas determining the current ratio will be the areas of the base-emitter junctions of the transistors. ("Diode-connected transistor" refers to a transistor having its base and collector electrodes connected to form one electrode of a diode equivalent, its emitter electrodes providing the other electrode.)

Figure 4:
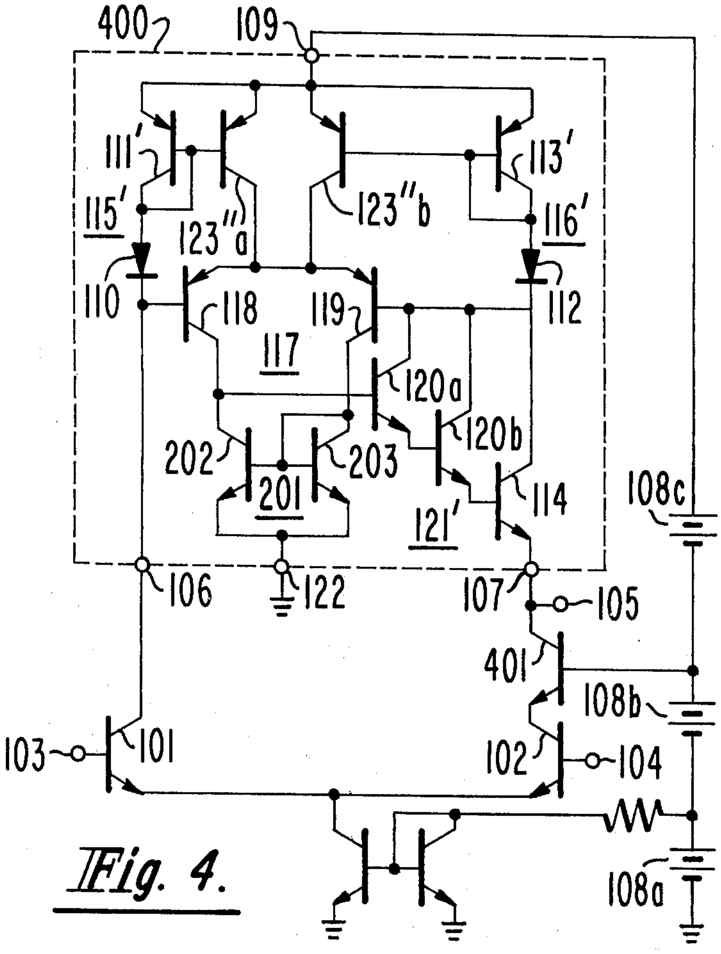

FIG. 4 shows a current amplifier 400 wherein composite transistor 121 of the previously described current amplifiers is replaced by a composite transistor 121', which comprises a Darlington cascade of three instead of two transistors. Increasing the number of component transistors in the composite transistor increases the output impedance offered by current amplifier 400 at output terminal 107, as well as permitting improvement of the accuracy of the proportioning of output and input currents. In the circuit shown, the higher output impedance of current amplifier 400 is used to complement the output impedance provided at the collector electrode of transistor 401 connected in cascode with transistor 102, which output impedances are relatively high compared to that provided by the collector of transistor 102 in the circuits of the previous FIGS. 1, 2 and 3.

Serially-connected elements in non-linear resistive networks 115' and 116' are re-arranged to provide biasing of the base-emitter circuits of transistors 123''a and 123''b, respectively, which together replace diode 123' of current amplifier 300. Transistor 123''a provides a collector current to the joined emitter electrodes of transistors 118 and 119, which collector current is related to the input current withdrawn from terminal 106 as the ratio of the base-emitter junction area of transistor 123''a to that of transistor 111', presuming their diffusion profiles to be alike. Transistor 123''b provides a collector current to the joined emitter electrodes of transistors 118 and 119 which is related to the output current supplied from terminal 107 as the ratio of the base-emitter junction area of transistor 123''b to that of transistor 113', presuming their diffusion profiles to be alike. Current amplifiers similar to current amplifier 400 but omitting either transistor 123''a or transistor 123''b, can also be made.

Figure 5:
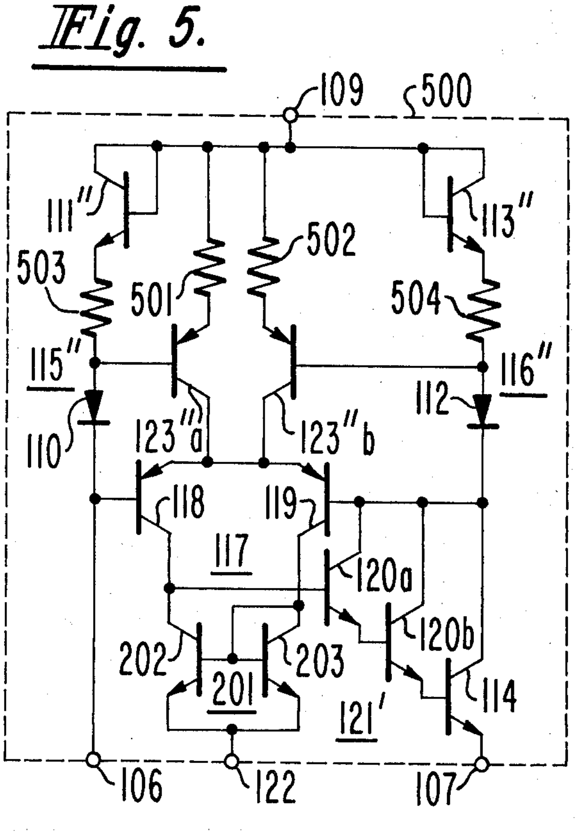

FIG. 5 shows a current amplifier 500 which is a modification of current mirror amplifier 400 of FIG. 4. Linear resistive elements 501 and 502 have been introduced into the emitter circuits of transistors 123''a and 123''b, respectively, to provide current feedback. This makes the current gains of transistors 123''a and 123''b, as combined with the diode-connected transistors 111'' and 113'' across their base-emitter junctions, less dependent upon close matching of transistors 123''a anad 123''b and those diode-connected transistors. To provide sufficient forward bias potential to transistor 123''a and 123''b when current feedback is introduced, linear resistive elements 503 and 504 are introduced into non-linear resistive networks 115'' and 116'', respectively. Preferably, the ratio of the resistances of the resistive elements 501 and 503 to each other is the same as the ratio of the resistances of the resistive elements 502 and 504 to each other, and the resistance of resistive element 503 is *k* times as large as that of resistive element 504.

The decreased need for proportioning the operating characteristics of PNP transistors 123''a and 123''b to PNP diode-connected transistors 111' and 113' permits NPN transistors 111'' and 113'' to be used instead of PNP transistors 111' and 113'. This can effect a saving in chip area on a conventional monolithic integrated circuit.

Figure 6:
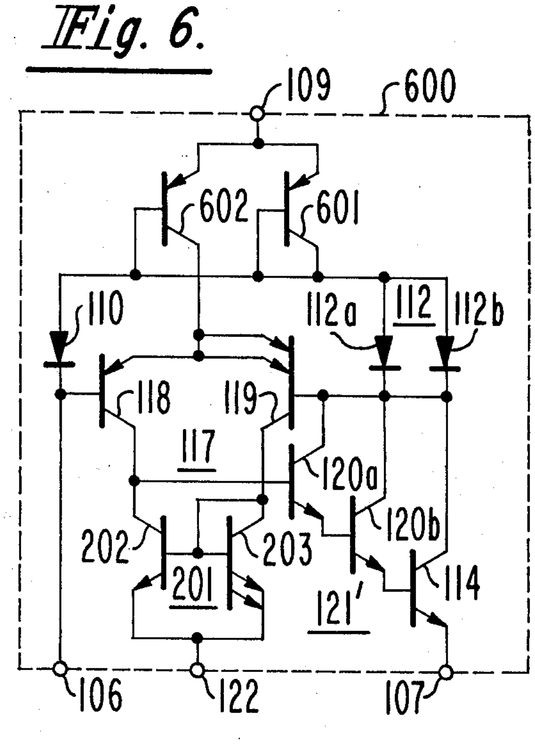

Current amplifier 600 of FIG. 6 also is a modification of current amplifier 400 of FIG. 4. The base electrodes of transistors 111' and 113' (FIG. 4) should be at equal potentials in current amplifier 400, permitting their connection together without disruptive effects on the operation of current amplifier 400. This done, the parallelled diode-connected transistors 111' and 113' may be replaced by a single diode-connected transistor 601, as shown in FIG. 6, and the parallelled transistors 123''a and 123''b may be replaced by a single transistor 602. This modification of the circuitry of current amplifier 400 results in a current mirror amplifier substantially the same as current amplifier 600.

The diode 112 of current amplifier 600 is shown as a composite diode comprising component diodes 112a and 112b, assumed identical to diode 110. This will cause *k*, the ratio of the current supplied from terminal 107 to be twice as large as the input current withdrawn to terminal 106, when current amplifier 600 is connected in circuit. The area of the base-emitter junction of transistor 203 is made twice as large as that of transistor 202, and the area of the base-emitter junction of transistor 119 is made twice as large as that of transistor 118, which measures are taken respectively to proportion the base currents of transistors 118 and 119 to be in 1:2 ratio and to equalize the base-emitter potential offsets of transistors 118 and 119 despite their corresponding currents being in 1:2 ratio.

A current amplifier also may be designed which is similar to current amplifier 600 but in which diodes 112a and 112b are replaced with a single diode 112, diode 110 is replaced by two parallelled diodes of the same conduction characteristics as diode 112, transistor 118 is made to have twice as much base-emitter junction area as transistor 119 rather than vice versa, and transistor 202 is made to have twice as much base-emitter junction area as transistor 203 rather than vice versa will have a current gain of —½. Current amplifiers having current gains of $-1/k$ or $-k$, where *k* is a positive integer, also can be made, using a technique similar to that used in the just forementioned current amplifier and current amplifier 600 (that is, by parallelling *k* diodes in place of diode 110 or 112, respectively).

Figure 7:
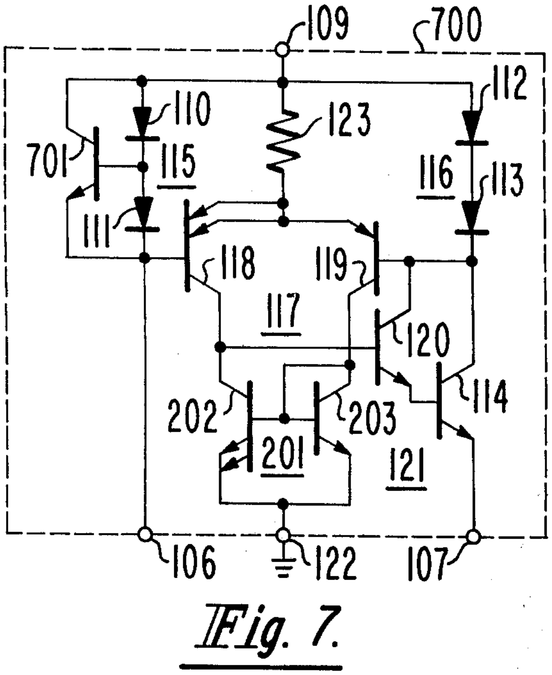

FIG. 7 shows a current amplifier 700 having a current gain of —½. Its non-linear resistive network 115 comprises a series connection of diodes 110, 111 similar to the series connection of diodes 112, 113 of non-linear resistor 116. The collector-to-emitter path of transistor 701 is connected in parallel with the series connection of diodes 110, 111 and is arranged to offer an equal conductance to that series connection by arranging for it to be in current mirror amplifier connection with diode 111.

A current amplifier with a current gain of —2 could be provided by modifying current amplifier 700 by transposing non-linear resistive networks 115 and 116. A preferred design would also modify differential amplifier 117 and current mirror amplifier 201 to forms like those shown in FIG. 6.

Figure 8:
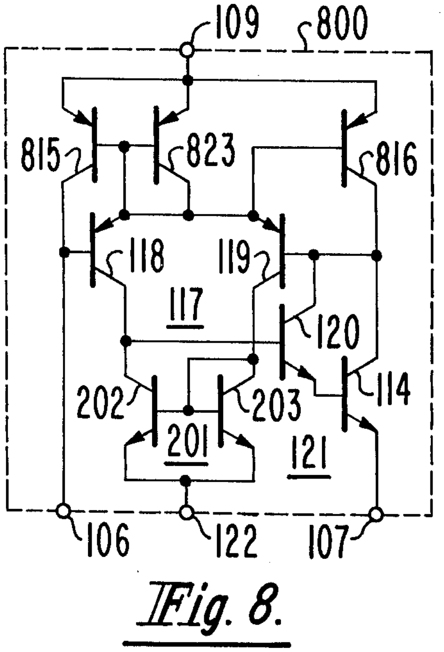

Current amplifier 800 of FIG. 8 is similar to current amplifier 300 of FIG. 3 except that non-linear resistive networks 115' and 116' have been replaced by the collector-to-emitter paths of transistors 815 and 816, respectively. Diode-connected transistor 823 corresponds to diode 123' in function. Collector-to-base feedback is applied to transistor 815 by a potential divider provided by the emitter follower action of transistor 118 working into the low impedance of diode-connected transistor 823. This feedback causes the collector-to-emitter path of transistor 815 to offer an impedance similar in characteristic to a series connection of diodes (e.g., 110, 111). Similarly, collector-to-base feedback is applied to transistor 816 by a potential divider provided by the emitter follower action of transistor 119 working into the low impedance of diode-connected transistor 823. This feedback causes the collector-to-emitter path of transistor 816 to offer an impedance similar in characteristic to a serial connection of diodes (e.g., 112, 113). The current gain of amplifier 800 will be equal to the ratio of the transconductance of transistor 816 to the transconductance of transistor 815.

Figure 9:
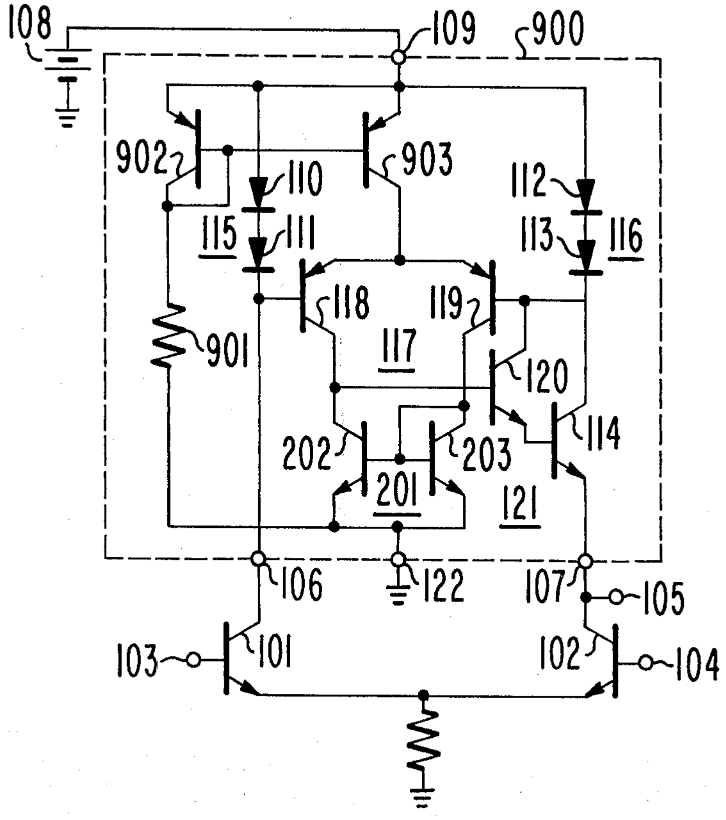

Current amplifier 900 of FIG. 9 differs from current amplifiers 200 and 300 of FIGS. 2 and 3, respectively, in that the current supplied to the joined emitter electrodes of transistors 118 and 119 is independent of input and output currents flowing through terminals 106 and 107, being provided from a substantially constant current source. This constant current source comprises elements 901, 902, 903. The bias network 901, 902 forward biases the base-emitter junction of transistor 903 to cause it to provide a substantially constant collector current. This constant collector current applied to the joined emitter electrodes of transistors 119 and 118 can maintain their transconductances at sustained levels despite a lowering of the input current being drawn from terminal 106. This keeps the gain of the differential amplifier 117 from falling, thereby maintaining loop gain in the collector-to-base feedback of composite transistor 121. The reduction of error in the proportioning of input and output currents is, then, as good at lower levels of input and output currents as at higher levels.

Considering the current amplifiers shown in FIGS. 1–9, it should be noted that, using the proportionment of elements which has been indicated as being preferable in each specific circuit, the respective contributions to the current withdrawn through input terminal 106 and to the current supplied from output terminal 107 made by the respective base currents of transistors 118 and 119 are in the same ratio as the other portions of these respective currents. That is, unlike the case with prior art current mirror amplifier designs the base currents of lateral-structure PNP transistors can be apportioned between the input and output terminals so as not to introduce an undesirable error term into the current gain of the current amplifier, which error term would vary as a function of the variation in the common-emitter forward current gain ($h_{fe}$) of PNP lateral-structure transistors.

Figure 10:
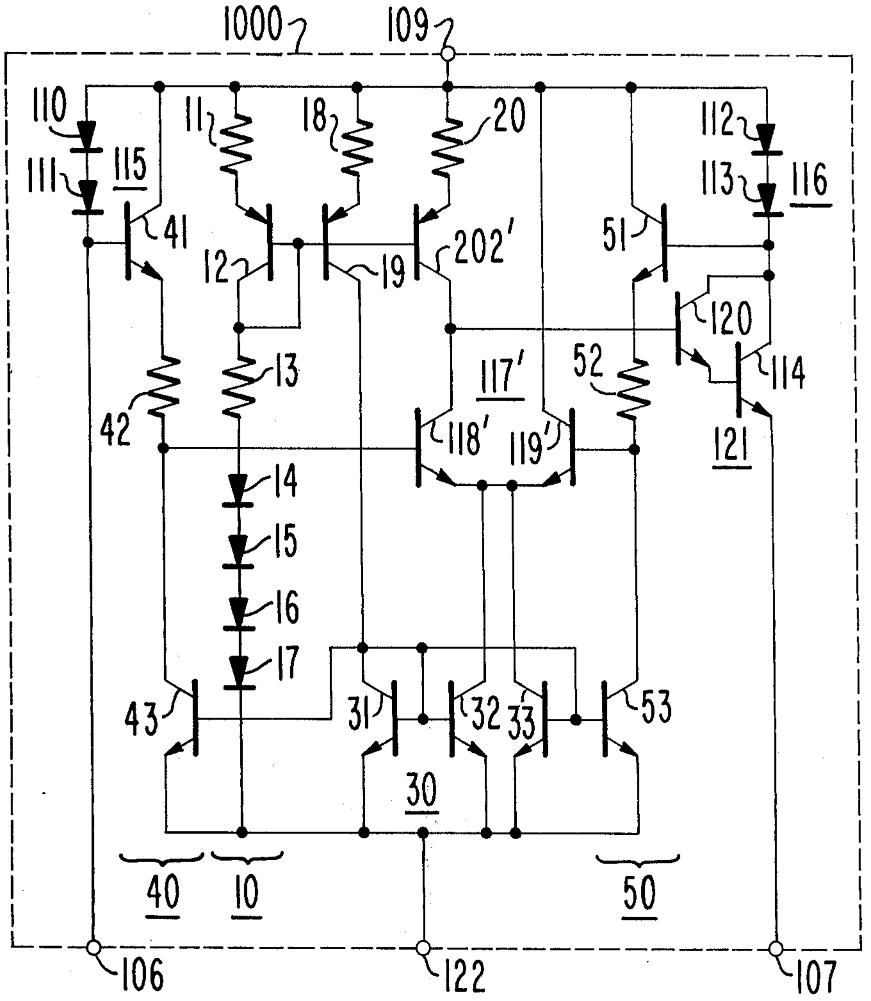

Current amplifier 1000 of FIG. 10 differs from those shown in the other FIGURES, primarily in that the differential amplifier 117 using PNP transistors 118 and 119 is replaced by differential amplifier 117′ using NPN transistors 118′ and 119′. Transistors 118′ is provided an active collector load by constant current transistors 202′ of complementary conductivity type.

The establishment of the quiescent bias currents of transistors 118′, 119′ and 202′ is in accordance with the teaching in my U.S. Patent Application Ser. No. 379,473, filed July 16, 1973; entitled "Biasing Circuit For Differential Amplifier" and assigned to a common assignee, RCA Corporation. A current level which is responsive to operating potential applied between terminals 122 and 109 is established according to Ohm's Law in the series connection 10, shown as comprising a resistor 13, a diode connected PNP transistor 12, a resistor 11 and bias compensation diodes 14–17. The potential developed across the serially connected resistor 11 and base-emitter junction of transistor 12 is applied to the serially connected resistor 18 and base-emitter junction of transistor 19 to cause a collector current flow from transistor 19, which is made equal to the current flow in series connection 10 by making the resistances of resistors 11 and 18 equal to each other. Similarly, resistor 20 is made equal in resistance to resistor 11, so the collector current flow from transistor 202′ is equal to the current flow in series connection 10. The collector current of transistor 19 is applied to the input port of a current mirror amplifier 30. Current mirror amplifier 30 comprises diode-connected transistor 31 and parallelled transistors 32 and 33, and has a current gain of 2 with regard to the current withdrawn from the joined emitter electrode of transistor 118′ and 119′. Half this current is demanded during quiescent conditions as emitter current from transistor 118; causing the transistor 118 to accept as quiescent current flow the collector current of transistor 202′.

Voltage translation networks 40 and 50 couple the potentials appearing across the resistive networks 115 and 116, respectively, to the base electrodes of transistors 118′ and 119′, respectively, to be compared to each other in the differential amplifier 117′. This translation is desirable for permitting free ranging of the base potential of transistor 120 in response to output potential at terminal 107 without causing forward biasing of the base-collector junction of transistor 118. Terminal 122 is biased to a potential which is generally negative with respect to the output terminal. As shown, these voltage translation networks 40 and 50 each comprise an emitter-follower transistor (41, 51) and a resistor (42, 52) across which a potential drop is generated by the constant collector current of another transistor (43, 53). The resistances of resistors 42 and 52 are made equal and the collector currents of transistors 43 and 53 are made equal, so the potential translation between the base electrodes of transistors 41 and 118′ is the same as the potential translation between the base electrodes of transistors 51 and 119′. The transistors 43 and 53 are also comprised within current mirror amplifier 30 and are made similar to transistor 31, so their collector currents are equal to the current applied to the input port of current mirror amplifier 30—that is, to the current flow in series connection 10. By making the resistances of resistors 42 and 52 equal to that of resistor 13, the quiescent base potentials of transistors 118′ and 119′ will be maintained two junction offset potentials more positive than the potential at terminal 122, despite variations in the operating potential between terminals 122 and 109. Other types of voltage translating networks such as avalanche diodes or chains of forward biased diodes may replace voltage translation networks 40 and 50, although these alternative networks do not have the attractive feature of regulating the base potentials of transistors 118′ and 119′ as referred to the potential at terminal 122 to a substantially constant, minimum necessary value.

Numerous alternative configurations embodying the present invention will be apparent to one skilled in the art of transistor circuit design. Certain of the design features discussed in connection with certain of the current amplifiers shown in the FIGURES may be combined in combinations different from those specifically shown.

A transistor with plural base-emitter junctions connected parallelly can be replaced by a transistor with a single-base-emitter junction of equivalent area. Use of such transistors with single base-emitter junction provides current mirror amplifier gains of $-k$ and $-1/k$, where $k$ is any positive number and is not limited to being an integer.

While the advantages of the present invention are particularly felt when design must be implemented with bipolar transistors having low forward current gains the circuits may be constructed using bipolar transistors having higher forward current gains or with field-effect transistors. The construction of the claims should be such as to include within their scopes, circuits using field effect transistors by reading the terms "base," "emitter" and "collector" as referring to the gate, source and drain electrodes, respectively, of the field-effect transistors.

What is claimed is:

1. A current amplifier comprising, in combination:

an input current path between an input terminal and a common terminal, said path including first non-linear resistive means for conducting an input current and developing a voltage thereacross responsive to said input current;

an output current path between an output terminal and said common terminal, said path including second non-linear resistive means for conducting an output current and developing a voltage thereacross responsive to said output current, said second non-linear resistive means having a current-versus-voltage characteristic proportional to that of said first non-linear resistive means;

a transistor having a base electrode and having emitter and collector electrodes and an emitter-to-collector path therebetween which is serially connected with said second nonlinear resistive means and included in said output current path;

differential amplifier means for responding to the difference between the voltage across said first non-linear resistive means and the voltage across said second non-linear means to supply a control current proportional to said voltage difference; and means for applying said control current to the base electrode of said transistor.

2. A current amplifier comprising:

an input, an output and a common terminals;

a differential amplifier having an inverting input port electrically connected between said input and said common terminals, having a non-inverting input port and having an output port;

a transistor having a collector electrode and having base and emitter electrodes with a base-emitter circuit therebetween to which the output port of said differential amplifier is coupled, said transistor emitter electrode being electrically connected to said output terminal;

a first non-linear resistance network electrically connected across the inverting input port of said differential amplifier;

and a second non-linear resistance network electrically connected between said transistor collector electrode and said common terminal as well as across the non-inverting input of said differential amplifier, the conductances of said first and said second non-linear resistance networks being in substantially fixed ratio to each other for a range of values of similar applied voltages.

3. A current amplifier as claimed in claim 2 wherein each of said first and said second non-linear resistance networks includes a plurality *n* of serially connected diodes.

4. An amplifire comprising:

first and second terminals for application of an operating potential therebetween;

a pair of input terminals for receiving input signals referred to said operating potential;

an output terminal;

first and second and third transistors, of a first conductivity type, each having a base and an emitter and a collector electrode, the base electrodes of said first and said second transistors being respectively electrically connected to separate ones of a pair of input terminals and their emitter electrodes being coupled to each other and direct current conductively coupled to said first terminal;

first and second resistive means electrically connecting the collector electrodes of said first transistor and of said third transistor, respectively, to said second terminal;

means for electrically connecting said second transistor collector electrode to said output terminal;

means for electrically connecting said third transistor emitter electrode to said output terminal;

fourth and fifth transistors, of a second conductivity type complementary to said first, each having a base and an emitter and a collector electrode, their emitter electrodes being coupled to each other and direct current conductively coupled to said second terminal; their base electrodes being connected respectively to said first transistor collector electrode and to said third transistor collector electrode;

means for electrically connecting said fourth transistor collector electrode to said third transistor base electrode; and means for direct current conductively coupling said fifth transistor collector electrode to said first terminal.

5. an amplifier as set forth in claim 4 wherein:

a current mirror amplifier has an input circuit corresponding to said means for direct current conductively coupling said fifth transistor collector electrode to said first terminal and has an output circuit electrically connecting said fourth transistor collector electrode to said first terminal.

6. An amplifier as set forth in claim 4 wherein said means for electrically connecting said fourth transistor collector electrode to said third transistor base electrode comprises at least one further transistor of said first conductivity type preceding said third transistor and being in Darlington cascade therewith.

7. An amplifier as set forth in claim 4 wherein said means for electrically connecting said second transistor collector electrode to said output terminal comprises at least one further transistor of said first conductivity type connected in common-base amplifier configuration and cascaded with said second transistor.

8. An amplifier as set forth in claim 4 wherein said first and said second resistive means are non-linear resistive means having proportionally related current versus potential characteristics.

9. A current amplifier comprising:

input, output and common terminals;

a first transistor means of a first conductivity type having an emitter electrode connected to said output terminal and having a base and a collector electrode;

a first and a second resistance with respective conductance characteristics proportionally related in the ratio 1:*k*, *k* being a positive number, said first resistance connected between said input and said common terminals, said second resistance connected between said common terminal and the collector electrode of said first transistor means;

a second and a third transistor means of a second conductivity type complementary to said frist, having respective base electrodes connected to said input terminal and to the collector electrode of said first transistor means, each having a collector and an emitter electrodes, and having transconductance characteristics proportionally related in the ratio 1:$k$;

direct current conductive means connecting the joined emitter electrodes of said second and third transistor means to said common terminal;

means for providing a current gain of $-1/k$ between its input connection to the collector electrode of said third transistor means and its output connection to the collector electrode of said second transistor means; and means connecting the collector electrode of said second transistor means to the base electrode of said first transistor means.

10. A current amplifier as claimed in claim 10 wherein $k$ is a fraction less than unity.

11. A current amplifier as claimed in claim 10 wherein $k$ is a number larger than unity.

12. A current amplifier comprising:

an input, an output and a common terminal;

first and second transistors of a first conductivity type and a third transistor of a second conductivity type dissimilar to the first, each of said transistors having a base and an emitter and a collector electrodes;

first and second circuit nodes similarly electrically connected to said transistor base electrode and to said second transistor base electrode, respectively;

a first non-linear resistance connected between said first circuit node and said common terminal;

a second non-linear resistance connected between said second circuit node and said common terminal;

a first electrical connection, being from said input terminal to said first circuit node;

a second electrical connection, being from said first transistor collector electrode to said third transistor base electrode;

direct current conductive means;

an electrical interconnection of the emitter electrodes of said first and said second transistors both to each other and to said common terminal through said direct current conductive means;

means for applying an operating potential to said second transistor collector electrode;

a third electrical connection, being between said third transistor emitter electrode and said output terminal; and a fourth electrical connection, being between said third transistor collector electrode and said second circuit node.

13. A current amplifier as set forth in claim 12 wherein said first and said second non-linear resistances each comprise a serial connection of a number $n$ of semiconductor rectifier elements.

14. A current amplifier as set forth in claim 13 wherein a resistor comprises said direct current conductive means.

15. A current amplifier as set forth in claim 13 wherein a semiconductor rectifier comprises said direct current conductive means.

16. A current amplifier as set forth in claim 13 wherein a direct current source comprises said direct current conductive means.

17. A current amplifier as set forth in claim 16 wherein $n$ is a plurality and said current source comprises a fourth transistor of said first conductivity type having an emitter electrode connected to said common terminal, having a collector electrode connected to said electrical interconnection of the emitter electrodes of said first and said second transistors and having a base electrode connected to an interconnection between a pair of the semiconductor rectifier elements included within said first non-linear resistance.

18. A current amplifier as set forth in claim 16 wherein said direct current source comprises a fourth transistor of said first conductivity type having an emitter electrode connected to said common terminal, having a collector electrode connected to said electrical interconnection of the emitter electrodes of said first and said second transistors and having a base electrode connected to an interconnection between a pair of the semiconductor rectifier elements included within said second non-linear resistance.

19. A current amplifier as set forth in claim 13 wherein each of said first and said second non-linear resistances comprises a series connection of a plurality n of semiconductor rectifiers and at least one of said first and said second non-linear resistances further includes a fifth transistor havng a collector and an emitter electrodes, between which said plurality n of semiconductor rectifiers included therewith are in serial connection with interconnections between adjoining ones of them and having a base electrode connected to one of said interconnections between adjoining semiconductor rectifiers.

20. A current amplifier as set forth in claim 12 wherein:

a fourth transistor of said first conductivity type has an emitter electrode electrically connected to said common terminal, has a collector electrode electrically connected to each of the emitter electrodes of said first and said second transistors, has a path between its emitter and collector electrodes corresponding to said direct current conductive means, and has a base electrode; and a first semiconductor rectifier element is connected between the base and the emitter electrodes of said fourth transistor, being poled for simultaneously increased conduction therewith, and is included in at least one of said first and second non-linear resistances.

21. A current amplifier as set forth in claim 20 wherein said first semiconductor rectifier element is included in both of said first and said second non-linear resistances, each of which non-linear resistances further includes a number m of additional semiconductor rectifier elements serially connected with said first semiconductor rectifier element.

22. A current amplifier as set forth in claim 12 wherein:

fourth and fifth transistors of said first conductivity type each have an emitter electrode electrically connected to said common terminal, each have a collector electrode connected to the emitter electrodes of said first and said second transistors, each having a path between its emitter and collector electrodes which together correspond to said direct current conductive means, and each have a base electrode;

a first semiconductor rectifier element is connected between the base and the emitter electrodes of said fourth transistor, being poled for simultaneously increased conduction therewith, and is included in said first non-linear resistive network; and a second semiconductor rectifier element is connected between the base and the emitter electrodes of said fifth transistor being poled for simultaneously increased conduction therewith, and is included in said second non-linear resistive network.

23. A current amplifier as set forth in claim 12 including:

fourth and fifth transistors of said first conductivity type, each having collector and emitter electrodes with a collector-to-emitter path therebetween and having a base electrode, the emitter electrodes of said fourth and fifth transistors each being connected to said common terminal and their base electrodes each being connected to said electrical interconnection of the emitter electrodes of said first and said second transistors, the collector-to-emitter paths of said first and said second transistors being respectively included in said first non-linear resistance and in said second non-linear resistance.

24. A current amplifier as claimed in claim 12 wherein at least one further transistor of said second conductivity type precedes said third transistor in Darlington cascade connection therewith to provide said second electrical connection via its base-emitter path.

25. A current amplifier as claimed in claim 12 having a current mirror amplifier with an input terminal connected to said second transistor collector electrode, a common terminal for connection to provide said means for supplying operating potential to said second transistor collector electrode and with an output terminal connected to said first transistor collector electrode.

26. A current amplifier comprising:

input, output and common terminals;

first, second and third transistors of a first conductivity type each having base and emitter and collector electrordes;

first and second circuit nodes;

first and second means for shifting potential levels, each for shifting a potential level by the same amount as the other, respectively connected between said first circuit node and said first transistor base electrode and between said second circuit node and said second transistor base electrode;

a first resistance connected between said first circuit node and said common terminal;

a second resistance connected between said second circuit node and said common terminal;

a first electrical connection, being from said input terminal to said first circuit node;

a second electrical connection, being from said first transistor collector electrode to said third transistor base electrode;

direct current conductive means;

an electrical interconnection of the emitter electrodes of said first and said second transistors both to each other and to said common terminal through said direct current conductive means;

means for applying a quiescent current to said first transistor collector electrode;

means for connecting said second transistor collector electrode to a point of operating potential;

a third electrical connection, being between said third transistor emitter electrode and said output terminal; and a fourth electrical connection, being between said third transistor collector electrode and said second circuit node.

27. A current amplifier as set forth in claim 26 wherein said first and said second resistances are non-linear resistances with current characteristics in ratio 1:$k$ at any potential over a range of potentials, $k$ being a positive number.

28. A current amplifier as set forth in claim 27 wherein said first and said second resistances each comprise a serial connection of a plurality of $n$ of semiconductor rectifier elements.

* * * * *

UNITED STATES PATENT OFFICE
CERTIFICATE OF CORRECTION

PATENT NO. : 3,904,976

DATED : September 9, 1975

INVENTOR(S) : Adel Abdel Aziz Ahmed

It is certified that error appears in the above-identified patent and that said Letters Patent are hereby corrected as shown below:

Column 9, line 43, "Transistors" should read --Transistor--.

Column 9 ,lines 44-45,"transistors" should read --transistor--.

Column 11, line 53, after "input" insert --port-- .

Column 11, line 62, "amplifire" should read --amplifier--.

Column 12 ,line 5, after "to" insert --said--.

Column 13, line 20, Claim 10 should be dependent on Claim 9.

Column 13 ,line 22, Claim 11 should be dependent on Claim 9.

Column 13, line 33, after "said" insert --first--.

Column 16 ,line 1 ,"electrordes" should read --electrodes--.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*